US009547089B2

(12) United States Patent
Elin et al.

(10) Patent No.: US 9,547,089 B2
(45) Date of Patent: Jan. 17, 2017

(54) IONIZING RADIATION SENSOR

(71) Applicant: OTKRYTOE AKTSIONERNOE OBSCHESTVO "INTERSOFT EVRAZIYA", Moscow (RU)

(72) Inventors: Vladimir Aleksandrovich Elin, Moscow (RU); Mikhail Moiseevich Merkin, Moscow (RU)

(73) Assignee: JSC Intersoft Eurasia, Moscow (RU)

( * ) Notice: Subject to any disclaimer, the term of this patent is extended or adjusted under 35 U.S.C. 154(b) by 0 days.

(21) Appl. No.: 14/913,445

(22) PCT Filed: Jul. 18, 2014

(86) PCT No.: PCT/RU2014/000527
§ 371 (c)(1),
(2) Date: Feb. 22, 2016

(87) PCT Pub. No.: WO2015/026262
PCT Pub. Date: Feb. 26, 2015

(65) Prior Publication Data
US 2016/0209518 A1 Jul. 21, 2016

(30) Foreign Application Priority Data
Aug. 22, 2013 (RU) ................... 2013139039

(51) Int. Cl.
*H01L 33/00* (2010.01)
*G01T 1/24* (2006.01)
(Continued)

(52) U.S. Cl.
CPC ............. *G01T 1/24* (2013.01); *H01L 29/0619* (2013.01); *H01L 31/028* (2013.01);
(Continued)

(58) Field of Classification Search
CPC ................... H01L 31/0224; H01L 31/022416; H01L 31/075; H01L 31/105; H01L 31/117; H01L 31/1175
(Continued)

(56) References Cited

U.S. PATENT DOCUMENTS

| 2010/0019342 A1* | 1/2010 | Kawano ............... H01L 29/0619 257/494 |
| 2014/0159150 A1* | 6/2014 | Kirisawa ........... H01L 29/66128 257/335 |
| 2016/0056306 A1* | 2/2016 | Masuoka ............ H01L 29/0615 257/483 |

FOREIGN PATENT DOCUMENTS

| EP | 2535740 A1 | 12/2012 |
| RU | 2248012 C2 | 3/2005 |
| RU | 87569 U1 | 10/2009 |

* cited by examiner

*Primary Examiner* — Minh-Loan Tran
(74) *Attorney, Agent, or Firm* — Nadya Reingand

(57) ABSTRACT

The invention relates to semiconductor devices for conversion of the ionizing radiation into an electrical signal enabling determination of the radiation level and absorbed dose of gamma, proton, electronic and alpha radiations being measured. The ionizing radiation sensor is a p-i-n structure fabricated by the planar technology. The sensor contains a high-resistance silicon substrate of n-type conductivity, on whose front side there are p-regions; layer from SiO2; aluminum metallization; and a passivating layer. P-region, located in the central part of the substrate and occupying the most surface area, forms the active region of the sensor. At least two p-regions in the form of circular elements are located in the inactive region on the perimeter of the substrate around the central p-region and ensure a decrease in the surface current value and smooth voltage drop from the active region to the device perimeter.

11 Claims, 3 Drawing Sheets

(51) Int. Cl.
*H01L 31/105* (2006.01)
*H01L 31/117* (2006.01)
*H01L 31/0224* (2006.01)
*H01L 31/075* (2012.01)
*H01L 31/0352* (2006.01)
*H01L 29/06* (2006.01)
*H01L 31/028* (2006.01)
*H01L 31/115* (2006.01)

(52) U.S. Cl.
CPC .. *H01L 31/0224* (2013.01); *H01L 31/022408* (2013.01); *H01L 31/022416* (2013.01); *H01L 31/0352* (2013.01); *H01L 31/075* (2013.01); *H01L 31/105* (2013.01); *H01L 31/115* (2013.01); *H01L 31/117* (2013.01); *H01L 31/1175* (2013.01)

(58) Field of Classification Search
USPC .................................................. 257/458, 459
See application file for complete search history.

IONIZING RADIATION SENSOR

CROSS-REFERENCE TO RELATED APPLICATIONS

The present application is a National stage application from PCT application No. PCT/RU2014/000527 filed on Jul. 18, 2014, which claims priority to Russian patent application RU 2013139039 filed on Aug. 22, 2013.

TECHNICAL FIELD OF THE INVENTION

The invention relates to semiconductor devices for conversion of the ionizing radiation into an electrical signal enabling determination of the radiation level and absorbed dose of gamma, proton, electronic and alpha radiations being measured. In particular, the invention relates to semiconductor sensing elements representing a p-i-n diode for various radiation measuring systems, dosimeters, high background radiation indicators and radiometers, including those for individual control of radioactive radiation and for warning of a radiation hazard. Currently, sensors based on p-i-n diodes continue being improved with allowance for the modern developments in the microelectronics technology.

BACKGROUND ART

Semiconductor sensors based on p-i-n diodes have been widely adopted as particle counters and as particle energy measuring devices (spectrometers) with high resolution. Their operating principle is based on the fact that a charge induced in the counter's substance is collected on the electrodes when an ionizing particle is passing through the sensor (sensing element).

Important feature of semiconductor counters is their small size. It has strongly extended the possibilities for application of these detectors not only in the area of experimental physics but also in the engineering—in devices for process control and in medicine.

A p-i-n-diode silicon, low-noise detector by the planar technology (Kemmer J. Fabrication of low noise silicon radiation detectors by the planar process//Nuclear Instruments and Methods.—1980.-V.169.-P.499-502.) and its further development (patent for invention U.S. Pat. No. 4,442,592) is known in the state-of-the-art. These papers disclose the methods for manufacture of detectors by the planar technology for radiation detection, which have semiconductor p-n junctions. However, the disclosed embodiments of the planar semiconductor diodes are different.

A semiconductor detector for X-ray and low-energy gamma radiation detection (patent for invention of the Russian Federation No. 2248012, IPC: G01T1/24, H01L31/1 15), made of monocrystalline silicon and containing a flat signal p+-n junction, around which there are circular guard p+-n junctions with electrodes and a preamplifier, the electrode of the flat signal p+-n junction being connected to the preamplifier input, and the electrode of the inner circular guard p+-n junction being connected to zero potential bus of the preamplifier is the closest to the technical solution applied for.

The invention resolves a problem of improvement in the overall performance of the device by draining the stray current of the guard ring for improvement of the energy resolution and contrast range of the measured energy spectrum. However, the apparatus is intended for detection of the X-ray and low-energy gamma radiation only. For sensitivity enhancement and high rate of detection of the whole spectrum of the ionizing radiation (except for the neutron one), it is necessary to increase the volume of a semiconductor to boost the probability of hitting and dispersion, for example, a gamma-quantum in it and accordingly to increase the rate of counting the radiation flux particles.

SUMMARY OF THE INVENTION

Object of the invention is to develop a sensing element to detect the ionizing radiation of all types of the charged particles and gamma-quanta in a wide range of energies and fluxes.

Technical effect, to be achieved by the applied patent is reduction in the time for radiation background measurement, considerable reduction in the size and weight of the sensor, extension of the detected energy range and possibility to detect various types of ionizing radiation. Silicon detectors can work without cooling with the equivalent noise irradiation being a few keV's.

The technical effect is achieved due to the sensor being operated at the voltages above the full depletion voltage, which allows using the whole thickness long of the silicon wafer as a detecting volume. Therefore, the detection is rising; the current pulse length is considerably reduced, and there is a possibility to detect a wide spectrum of radiation for both charged particles and gamma-quanta.

The set problem is resolved by the following: the ionizing radiation sensor represents a p-i-n structure by the planar technology, containing a high-resistance silicon substrate of the n-type conductivity, on the front (working) side of which there are:

p-regions formed by the ion implantation method;
masking $SiO_2$ layer grown;
aluminum metallization applied; and
passivating (protective) layer applied.

Thus, at least one p-region is located in the central part of the substrate and occupies the most surface area, forming an active region of the sensor; at least two p-regions are in the form of circular elements (guard rings) and are concentrically located in the inactive region on the substrate perimeter for decrease of the surface current value and smooth voltage drop from the active region to the device perimeter. In the $SiO_2$ layer, there are windows to ensure the contact between the metal (aluminum metallization) and the p-region; in the passivating layer, there are windows for connection of the leads. On the substrate side opposite to the front surface, there is an n-region layer and a metal layer.

Total area of the windows for the contact between the metal (aluminum metallization) and the p-region doesn't exceed 1% of the surface area of the active region of the detector in order to prevent diffusion of aluminum into silicon.

Number of windows for connection of the leads is equal to 4, the windows being located along the edges of the substrate—one on each side. Windows for connection of the leads are located in the inactive region of the substrate. P-region, located in the central part of the substrate, has shaped sections along the edges in the form of grooves ensuring formation of inactive zones for location of the windows for connection of the leads. A high-purity, floating-zone silicon wafer with specific resistance of 3÷12 kOhm·cm and thickness of 250-1,000 μm is used as a silicon substrate. Number of circular elements (guard rings), located at a distance from each other, which is increasing from the substrate center to the perimeter, is equal to 4. In one embodiment, the width of the circular elements is equal to 25 μm, the distance between the first and the second element being equal to 40 μm that between the second and the third being 50 μm, between the third and the fourth being 70 μm, wherein the first element is at a distance of 40 μm from the boundary of the sensitive p-region, the said values varying in the range of 20%. Accuracy of the said dimensions during fabrication of the sensor is determined by the accuracy of mask plate fabrication and is ±0.1 μm. The substrate can be selected with the working surface dimensions of up to 102×102 mm$^2$, the dimensions of the active region being equal to 100×100 mm$^2$, the sensor thickness being equal to 250+1,000 μm (determined by the wafer thickness), and the area occupied by the circular elements being equal to no more than 1 mm on the substrate perimeter. This embodiment of the sensor ensures the achievement of the following electrical characteristics: value of the reverse bias of 40+200V until the achievement of a full depletion mode depending on the specific resistance and thickness of the sensor, operating mode characterized by the reverse bias at the full depletion; operating voltage determined from the full depletion voltage value ($V_{FD}$) of $V_{op}=V_{FD}+20V$; breakdown voltage of not less than $2V_{FD}$; dark current of no more than 200 nA/cm at the operating voltage; the measurements of the said parameters being taken at a temperature of 20±2° C.

The planar technology method for manufacturing of the ionizing radiation sensor comprises manufacturing of a set of 4 working mask plates for contact photolithography, the first being a mask plate for formation of a p+-region, the second being for formation of contacts to the p+-region of the diode and to guard rings on the perimeter of the wafer front side; the third being for Al-metallization; and the fourth being for formation of contacts to metallization.

BRIEF DESCRIPTION OF THE DRAWINGS

The invention is further explained with the drawings, where
FIG. 1 schematically shows the device applied for,
FIGS. 2 and 3 show sections A-A and B-B of FIG. 1 respectively.

Figure 1:
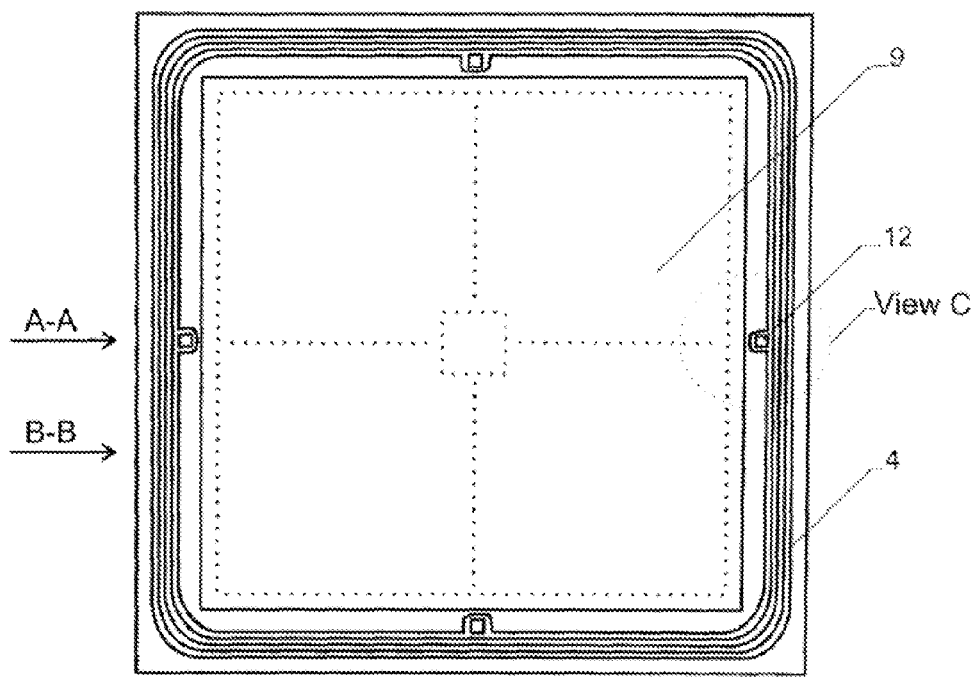
Figure 2:
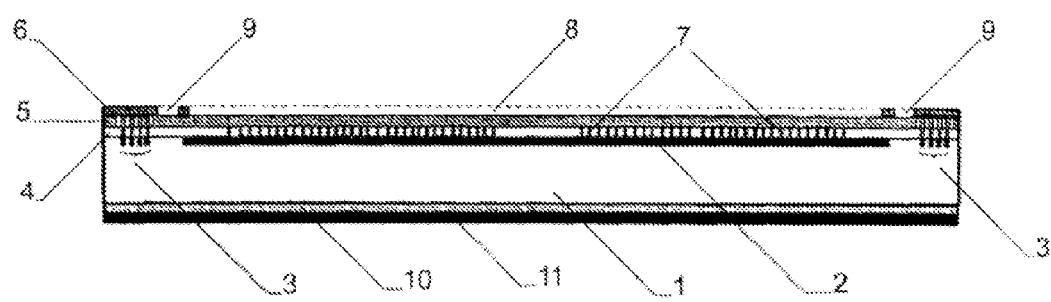
Figure 3:
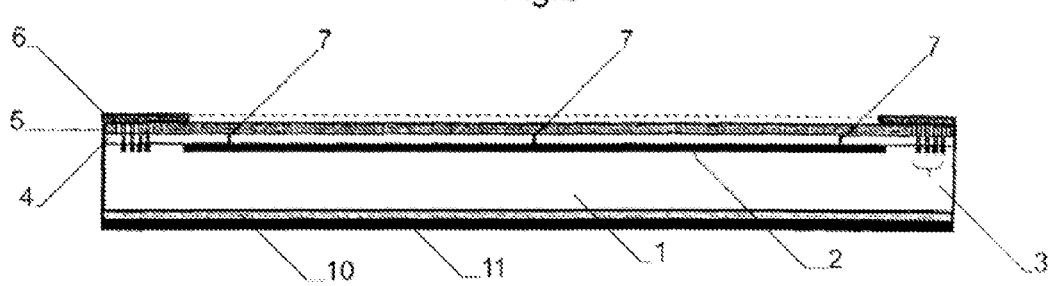
Figure 4:
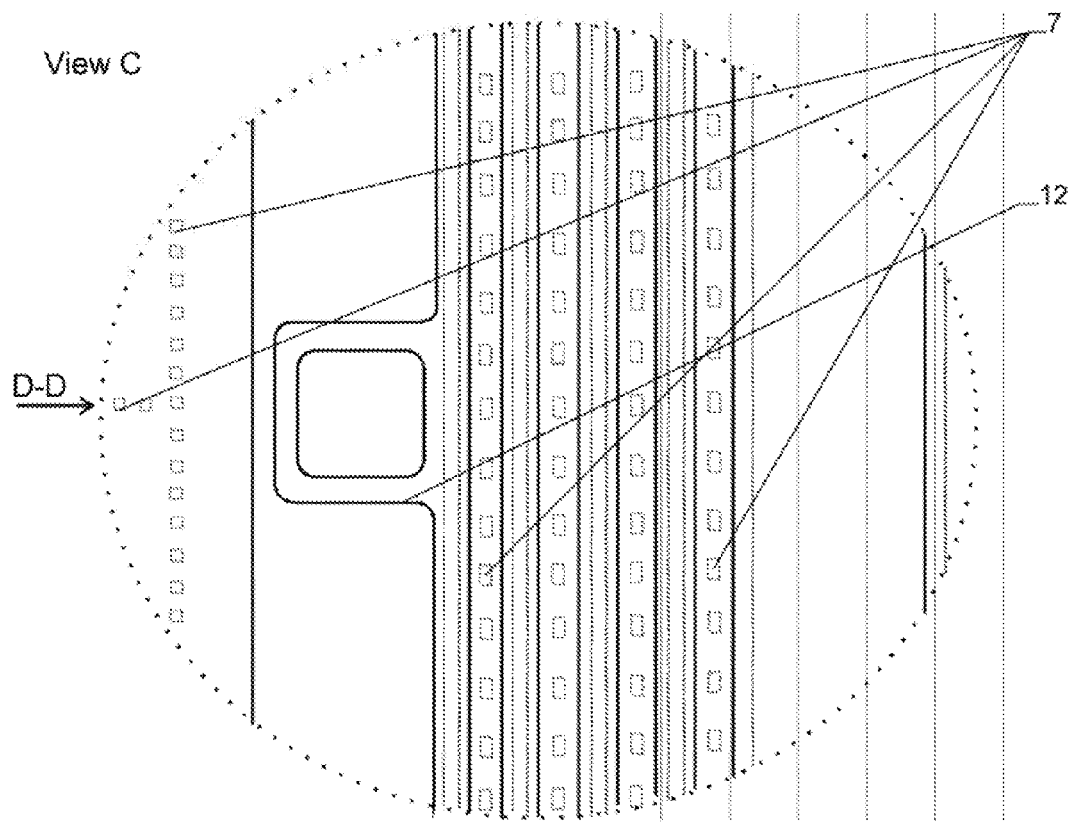
FIG. 4 shows detail C of FIG. 1.
Figure 5:
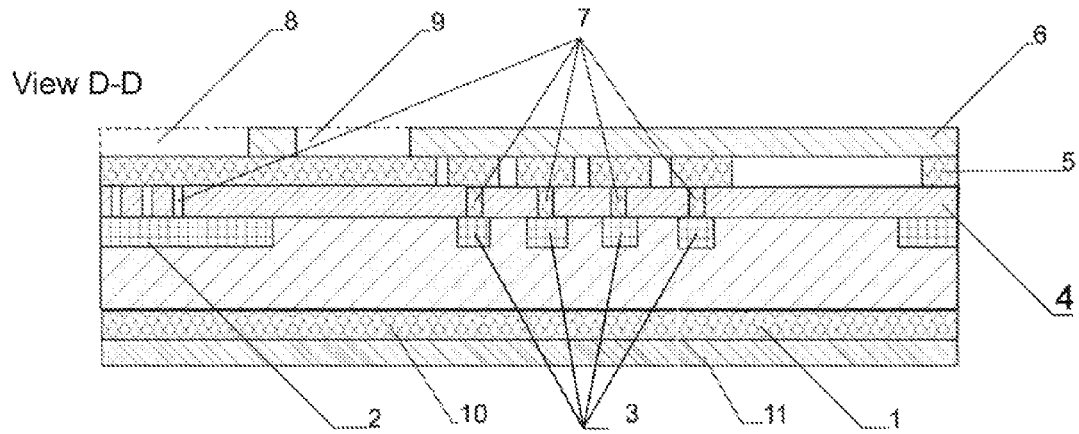
FIG. 5 shows section D-D of FIG. 4.

The following is designated by items on the figures: 1—high-resistance silicon substrate of n-type conductivity; 2—p-region, located in the central part of the substrate, forming an active region of the sensor; 3—p-regions being guard rings; 4—SiO$_2$ layer (coating); 5—aluminum metallization forming one of the sensor electrodes; 6—passivating (protective) layer 7—windows for the contact between the metal (aluminum metallization) and the p-region, formed in the SiO$_2$ layer, 8—window for contacting with the p-n-region in the process of testing, located in the passivating layer over the p-region in the central part of the substrate; 9—windows for connection of leads; 10—n-region, located on the back side of the substrate; 11—aluminum metallization on back side of the substrate forming the second electrode of the sensor, 12—shaped sections along the substrate edges in the form of grooves ensuring the formation of the inactive regions for location of windows 9 for connection of leads.

EMBODIMENT OF THE INVENTION

The ionizing radiation sensor (sensing element) is a p-i-n structure fabricated by the planar technology. The sensor contains a high-resistance silicon substrate of n-type conductivity 1 (see FIG. 1-5), on the front (working) side of which there are p-regions 2, 3; SiO$_2$ layer (coating) 4; aluminum metallization 5; and passivating (protective) layer 6 from phosphate-silicate glass (SiO$_2$+P$_2$O$_5$). Thickness of the layers is determined by their manufacturing process and is as a rule no more than 0.5+1.1 μm.

P-region 2, located in the central part of the substrate and occupying the most surface area, forms an active region of the sensor. At least two p-regions 3 are in the form of circular elements (guard rings) are located in the inactive region on the substrate perimeter around central p-region 2 ensuring a decrease in the surface current value and smooth voltage drop from the active region to the device perimeter. In SiO$_2$ layer 4, there are windows 7 for the contact between the metal (aluminum metallization) and the p-region; in the passivating layer over the p-region, located in the central part of the substrate, there is window 8 for contacting with the p-n-region in the process of testing and window 9 for connection of leads. On the substrate side opposite to the front surface, there is high-doped n*-layer 10 layer with a thickness of 2+4 μm, doped with up to 10$^{19}$ atoms of the donor impurity per cm$^3$, and aluminum metallization layer 11 with thickness of 0.9+1.1 μm.

Total area of windows 7 for the contact between the metal (aluminum metallization) and the p-region doesn't exceed 1% of the surface area of the detector active region for prevention of aluminum diffusion into silicon.

Number of windows 9 for connection of leads is equal to 4, the windows being located along the edges of the substrate—one on each side. Windows for connection of leads are located in the inactive region of the substrate. P-region 2, located in the central part of the substrate, has shaped sections along the edges in the form of grooves 12 (see FIG. 1) ensuring formation of inactive regions for location of windows 9 for connection of the leads. A high-purity, floating-zone silicon wafer with a specific resistance of 3+12 kOhm·cm and thickness of 250-1,000 μm is used as a silicon substrate. Number of circular elements (guard rings), located at a distance from each other, and the distance being increased from the substrate center to the perimeter, is equal to 4. Number and configuration of the guard rings is determined considering the manufacturing process specifics. The system of guard rings must ensure smooth voltage drop from the active region to the sensor edge.

In one embodiment, the width of the circular elements 3 is equal to 25 μm, the distance between the first and the second element being equal to 40 μm, that between the second and the third being 50 μm, between the third and the fourth being 70 μm, wherein the first element is at a distance of 40 μm from the boundary of the sensitive p-region, the said values varying in the range of 20%. Accuracy of the said dimensions during fabrication of the sensor is determined by the accuracy of mask plate fabrication and is ±0.1 μm. The substrate can be selected with the working surface dimensions of up to 102×102 mm$^2$, the dimensions of the active region being equal to 100×100 mm$^2$, the sensor thickness being equal to 250+1,000 μm (determined by the wafer thickness), and the area occupied by the circular elements being equal to no more than 1 mm on the substrate perimeter. This embodiment of the sensor ensures achievement of the following electrical characteristics: value of the reverse bias of 40+200V until the achievement of a full depletion mode depending on the specific resistance and thickness of the sensor; operating mode characterized by the reverse bias at the full depletion; operating voltage determined from the full depletion voltage value ($V_{FD}$) of $V_{op}=V_{FD}+20V$; breakdown voltage of not less than $2V_{FD}$; dark current of no more than 200 nA/cm² at the operating voltage; the measurements of the said parameters being taken at a temperature of 20±2° C.

The sensors are fabricated by the planar technology being a set of manufacturing operations helping to form the structures of planar semiconductor sensors on one side of a wafer cut from a silicon monocrystal of up to 150 mm in diameter. Specifically, the invention can be embodied by a technology close to that presented in publications of Kemmer (Kemmer J. Fabrication of low noise silicon radiation detectors by the planar process//Nuclear Instruments and Methods. 1980.-V.169.-P.499-502.).

The planar technology is based on creation of regions with different types of conductivity or with different concentrations of the same impurity, together forming the sensor's structure, in the near-surface layer of the substrate. Regions of the structures are formed by local introduction of impurities in the substrate (by means of gas phase diffusion or ion implantation) through a mask (typically from a $SiO_2$ film), formed by photolithography. By successive conduction of oxidizing (creation of a $SiO_2$ film), photolithography and doping processes, a doped region of any required configuration is obtained, as well as regions with other type of conductivity (or other impurity concentration). The planar technology enables simultaneous manufacturing of a great number (up to several hundreds and even thousands) of identical discrete semiconductor devices (e.g. sensors) or integrated circuits on one wafer in a single process. Batch processing ensures a good repeatability of the devices parameters and high efficiency at relatively low unit cost.

Figure 6:
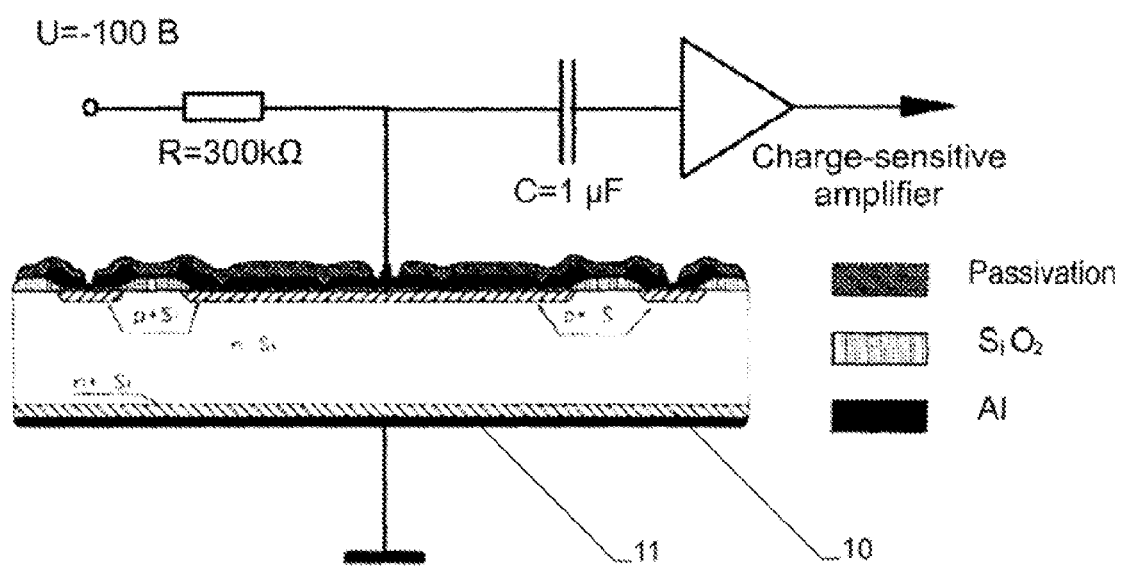
FIG. 6 is a diagram for taking of the electrical charge from the sensor for transmission to a recording device.

The ionizing radiation sensor works as follows. Quanta of the X-ray and low-energy gamma radiation, entering the sensor's material, react with it that results in the production—depending on the incident quantum energy—of a photoelectron, Compton electron or an electron-positron pair. Probability of this process is 0.01+0.03, but taking into account that the probability of detection of a charged particle (electron, positron, proton, alpha-particle etc.) is equal to 1, this is quite enough for consistent detection of the ionizing gamma radiation, even at the background level, with an accuracy of not less than 20% for 1+2 minutes of measuring. Charged particles penetrate into the active region of the sensor and generate electron-hole pairs in it. Charge carriers (electrons and holes) disperse under the action of the electric field applied to the semiconductor sensor and move to the electrodes. As a result, there is an electrical impulse in the external circuit of the semiconductor detector detected by a charge-sensitive preamplifier, converted into a voltage drop at its output and then transmitted to a signal processor (see FIG. 6 for example).

A test specimen, in which the semiconductor sensor (detector) is a high-voltage p-i-n diode in the form of a single-sided structure fabricated by the planar technology on a high-purity, floating-zone melting silicon substrate with a specific resistance of 3+4 kOhm·cm, with the overall dimensions of 12×12 mm and thickness of 450 μm, was created to check the performance efficiency of the sensor. The construction of the manufactured sensor corresponds to the embodiment, presented in FIG. 1-5. Flat signal p+-n junction represents an ion-implanted p+-region with an increased concentration of boron atoms. Circular guard p+-n junctions by the same method as flat signal p+-n junction, located in the central part of the substrate, are arranged around the flat signal p+-n junction, occupying the most part of the substrate (size of the active region was 10×10 mm²). Perimeter of the region, occupied with the guard rings, was not more than 1 mm. Metal electrodes were made of aluminum. On the substrate side opposite to the front surface, there is high-doped n*-layer 10 layer with a thickness of 2+4 μm, doped with up to $10^{19}$ atoms of the donor impurity per cm³, and aluminum metallization layer 11 with a thickness of 0.9+1.1 μm.

Set of 4 working mask plates (m/p) for the contact photolithography was used in manufacturing of the sensor by the planar technology, the first of which is a mask plate for formation of a p+-region, the second is for formation of contacts to the p+-region of the diode and to guard rings on the perimeter of the wafer front side; the third is for Al-metallization; and the fourth is for formation of contacts to metallization. The masks are listed in the order of their use in the process. Thus, the minimum width of the perimeter rings was 25 μm in the first m/p; the minimum contact size in the second m/p for the formation of contacts to the p+-diode and guard rings on the perimeter of the front side of the wafer was 25×25 μm²; on the perimeter to the guard rings—10×40 and 40×10 μm²; the minimum width of the rings on the diode perimeter in the third m/p for Al-metallization was 20 μm; dimensions of the fourth m/p for the formation of contacts to the central region of metallization are not critical.

The manufactured device had the following electrical characteristics:
Operating mode—reverse bias at the full depletion.
Operating voltage is determined from the full depletion voltage value $(V_{FD})$–$V_{op}$=$V_{FD}$+20V;
Breakdown voltage, not less than $-2·V_{FD}$;
Dark current at operating voltage, no more than −200 nA/cm;

All measurements were taken at a temperature of 20±2° C. Test structures for determination of the specific resistance of the p-region by the four-point method are located on the wafer. Connection of the guard rings was not provided for.

The invention thus provides a sensor, which can be used in various devices for detection and/or measurement of the ionizing radiation. The sensor has small dimensions—possibility of being used in portable, self-contained devices; reliable detection of any ionizing radiation in combination with a wide operating temperature range; high sensitivity (possibility of operation in a gamma-quants counting mode); high radiation resistance of the detector material; wide measuring range; elimination of the necessity for periodic servicing; low power consumption; and low-voltage power supply.

What is claimed is:

1. An ionizing radiation sensor in a form of a p-i-n structure, containing:
    a high-resistance silicon substrate of n-type conductivity, on a front working side of which there are p-regions and a masking coating of $SiO_2$;
    aluminum metallization;
    passivating layer;
    on a back side of the substrate, there are a high-doped layer of an n-region and an aluminum metallization;
    wherein at least one p-region is located in a central part of the substrate and occupies most of the surface area, forming an active region of the sensor, and at least two p-regions in a form of circular elements are located in an inactive region on a perimeter of the substrate to decrease a surface current value and ensure a smooth voltage drop from the active region to the substrate perimeter; in the $SiO_2$ coating layer, there are windows to ensure a contact between the aluminum and the p-region; in the passivating layer, there are windows for connection of leads.

2. The sensor according to claim 1, wherein the sensor is fabricated by the planar technology with the use of contact photolithography.

3. The sensor according to claim 1, wherein a total area of the windows for ensuring of the contact between the aluminum and the p-region doesn't exceed 1% of a surface area of the active region of the sensor to prevent aluminum diffusion into silicon.

4. The sensor according to claim 1, wherein a number of windows for connection of the leads is equal to 4, the windows being located along edges of the substrate-one on each side.

5. The sensor according to claim 1, wherein the windows for connection of the leads are located in the inactive region of the substrate.

6. The sensor according to claim 1, wherein the p-region, located in the central part of the substrate, has shaped sections along edges in a form of grooves ensuring formation of inactive zones for location of the windows for connection of the leads.

7. The sensor according to claim 1, wherein a wafer of high-purity, floating-zone silicon with a specific resistance of 3÷12 kOhm·cm and thickness of 250-1,000 μm is used as the silicon substrate.

8. The sensor according to claim 1, wherein a number of circular elements serving as guard rings, located at a distance from each other, the distance being increased from a substrate center to the perimeter, is equal to 4.

9. The sensor according to claim 8, wherein a width of the circular elements is equal to 25 μm, a distance between a first and a second element being equal to 40 μm, that between the second and a third being 50 μm, between the third and a fourth being 70 μm, wherein the first element is at a distance of 40 μm from a boundary of the p region, the said values having a permissible tolerance of 20%.

10. The sensor according to claim 1, wherein the substrate has a working surface dimensions of 102×102 mm$^2$, dimensions of the active region being equal to 100×100 mm$^2$, a sensor thickness being equal to 250÷1,000 μm, and an area occupied by the circular elements being equal to no more than 1 m on the substrate perimeter.

11. The sensor according to claim 1, said sensor ensuring an achievement of following electrical characteristics: a value of a reverse bias of 40÷200V until an achievement of a full depletion mode depending on a specific resistance and a thickness of the sensor; an operating mode characterized by the reverse bias at the full depletion; an operating voltage determined from a full depletion voltage value ($V_{FD}$) of $V_{op}=V_{FD}+20V$; a breakdown voltage of not less than $2V_{FD}$; a dark current of no more than 200 nA/cm$^2$ at the operating voltage; measurements of said parameters being taken at a temperature of 20±2° C.

* * * * *